United States Patent
Song et al.

(10) Patent No.: US 7,577,893 B2
(45) Date of Patent: Aug. 18, 2009

(54) FORWARD ERROR CORRECTION DECODING METHOD AND APPARATUS FOR SATELLITE DIGITAL AUDIO RADIO BROADCASTING

(75) Inventors: Jie Song, Macungie, PA (US); Robert Conrad Malkemes, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 612 days.

(21) Appl. No.: 11/448,616

(22) Filed: Jun. 7, 2006

(65) Prior Publication Data

US 2007/0288827 A1 Dec. 13, 2007

(51) Int. Cl.
*H03M 13/29* (2006.01)
(52) U.S. Cl. .................................. 714/755
(58) Field of Classification Search ............. 714/755
See application file for complete search history.

(56) References Cited

U.S. PATENT DOCUMENTS 6,298,461 B1 * 10/2001 Tong et al. ............... 714/755
6,473,010 B1 * 10/2002 Vityaev et al. ............ 341/107
6,831,574 B1 * 12/2004 Mills et al. ................ 714/786
7,310,768 B2 * 12/2007 Eidson et al. ............. 714/786
7,444,582 B1 * 10/2008 Au et al. ................... 714/784

OTHER PUBLICATIONS

Aitsab et al, "Performance of Concatenated Reed-Solomon/Convolutional Codes with Iterative Decoding", Globecom '97, Sep. 1997, pp. 934-938.*
Ben-Haim et al, "Iterative Decoding of 8-DPSK with Reed-Solomon Code", Proc. 23rd IEEE Conv. of Electrical and Electronic Engineers in Israel, Sep. 2004, pp. 106-109.*

* cited by examiner

*Primary Examiner*—Stephen M Baker

(57) ABSTRACT

The present invention relates to an improved decoding scheme for use in a concatenated channel decoder. In the present invention, the decoding of the concatenated code is done iteratively to increase the confidence for any corrected symbols. As a result, the overall performance of the decoder is improved. This iterative process comprises using a Maximal a posteriori (MAP) decoder which generates decoded information, to include Erasure Information. The output of the MAP decoder is then supplied to a Reed Solomon (RS) decoder, which attains better error correction performance by using this Erasure Information. This improved output of the RS decoder is then supplied back to the MAP decoder, thereby improving the performance of the system.

14 Claims, 2 Drawing Sheets

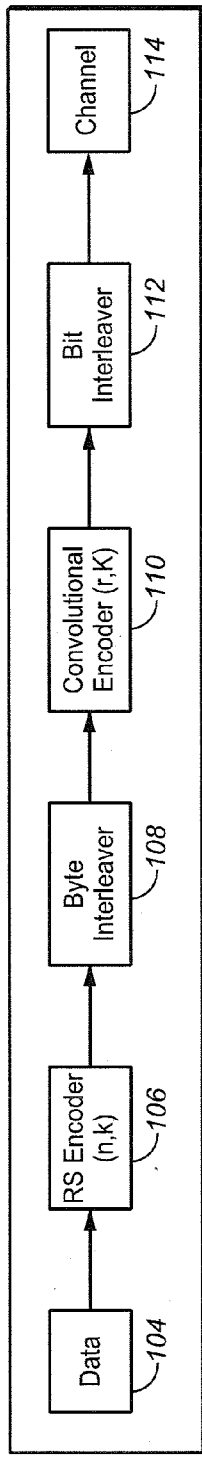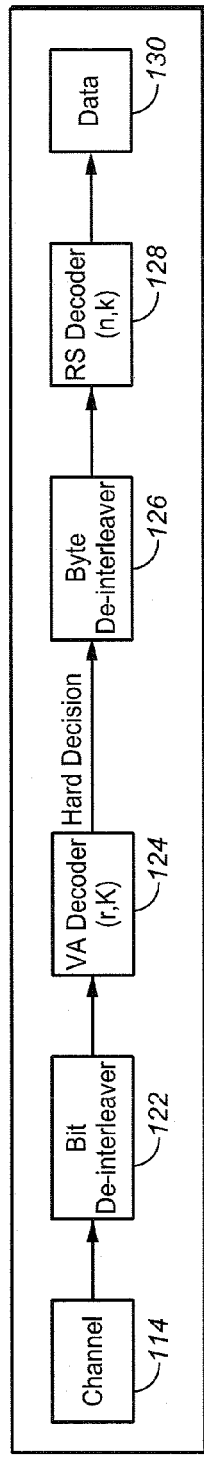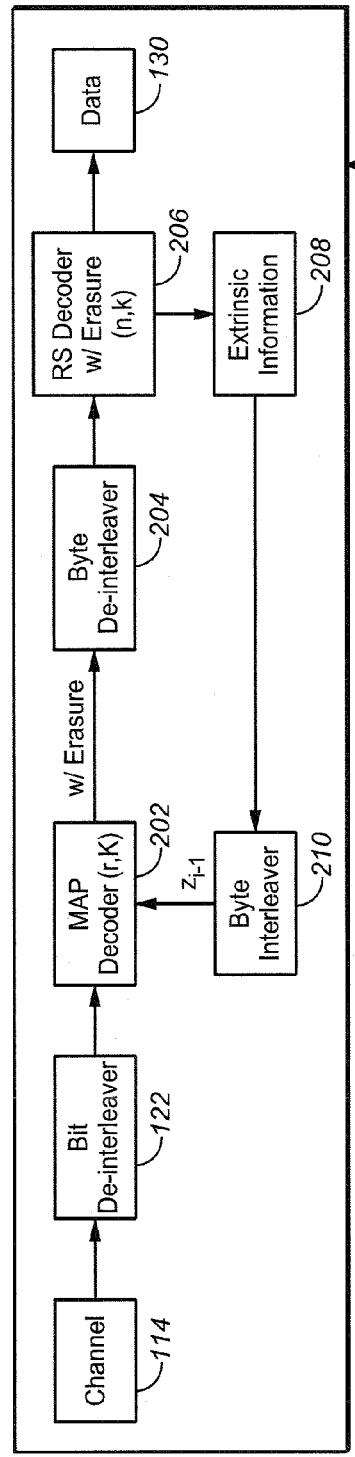

FORWARD ERROR CORRECTION DECODING METHOD AND APPARATUS FOR SATELLITE DIGITAL AUDIO RADIO BROADCASTING

FIELD OF THE INVENTION

The present invention relates generally to communication systems and iterative decoding performance. In particular, it relates to an improved method and apparatus for decoding data that has been encoded using a concatenated code consisting of a convolutional code and a Reed-Solomon (RS) code.

BACKGROUND OF THE INVENTION

Communication systems are often limited in terms of transmitter power and spectrum availability. For these and other reasons, it is often a goal of digital communications design to maximize the transmission bit rate R and minimize the probability of bit error, or Bit Error Rate (BER), for a given system power S, and bandwidth B. One example of such communications design relates to Satellite Digital Audio Radio Systems (SDARS). The performance of current SDARS receivers is degraded significantly in areas of dense foliage where the signal is weak. Further, this performance varies rapidly when deployed in a vehicle which is in motion. Past efforts to address this problem have typically focused on increasing the transmission power by deploying more terrestrial repeaters in such weak signal areas. This approach is not always possible and where it can be employed, it entails significant costs.

One well-known means for improving communication performance in digital communications is the use of Forward Error Correction (FEC) techniques. FEC is used to find and correct limited errors caused by a transport system in order to ensure the validity of the received message without requiring retransmissions. In general, FEC encoding techniques, such as Reed-Solomon (RS) encoding, provide data redundancy by adding extra code symbols to a transmitted message. This redundant data provides the necessary error detection and correction information. RS encoding is an example of a block code where the data to be transmitted are divided into blocks, with each block comprising k symbols of data. An additional r redundancy symbols are then added to each block of k data symbols to form a code word of length n=k+r.

While conventional FEC techniques may be used more or less successfully to correct errors, they generally must be designed with a redundancy that is greater than the number of errors they are expected to correct, with RS codes requiring up to twice as many redundancy symbols as error symbols. The greater the redundancy, the less room there is for data in each code word and the less throughput of the communication channel due to error correction overhead.

The process of decoding of error correcting codes involves a comparison of the probabilities for different codewords. Typically, each such probability relates to the occurrence of some event given a certain amount of information about the event. Thus, the probability that x was sent, p(x), is the probability that x was sent given the amount of information that is known about the event. Usually this is only the received noisy version of x and the knowledge of the coding scheme, transmission link, etc.

In some situations, there is some knowledge of the transmitted signal before the received one is decoded. This may be information that some messages are more likely to occur than others or information from other transmitted sequences. This information is called a priori information, and the corresponding probabilities, a priori probabilities. Similarly, posteriori probabilities are inductively derived from the facts of the received signal. These facts include information gained by the decoding process as well as the a priori information.

More recent efforts to improve the signal to noise ratio (SNR) in the digital communications art has employed coding/decoding schemes, called "Turbo Codes". The basic concept of turbo codes is to use two convolutional codes in series (or in parallel) with some kind of interleaving in between. Thus, for turbo codes there exist two encoded sequences. In decoding the received signal, one of these sequences is first decoded to yield a first estimate of the information sequence. This estimate is typically then used as a priori information in the decoding of the second encoded sequence.

One form of this turbo decoding process operates upon serial concatenated codes and typically employs iterative decoding. Not all of such serially concatenated codes are iteratively decoded in practice, however. As an example, a serial concatenation of an outer, block code (e.g., an RS code) and an inner, convolutional code can be found in many communications and data storage applications requiring very low bit error rates. This type of serial concatenation is used, for example, in DBS (Direct Broadcast Satellite) standards. However, in practice, this serial concatenated code is not iteratively decoded.

An example of a typical serial concatenated system is illustrated in FIGS. 1A and 1B. FIG. 1A depicts a transmitter portion 102 of such a serial concatenated system for communicating encoded information. FIG. 1B depicts a corresponding receiver portion 120. The transmitter portion 102 uses an outer code encoder or block encoder 106 (e.g., a Reed-Solomon encoder) to encode input bits of data 104. The output of the outer code encoder 106 is then provided to a Byte Interleaver 108 wherein the signal bit order is shuffled in a predetermined manner. Next, the output of the Byte Interleaver is provided to an inner code encoder (e.g., Convolutional Encoder 110). The output of the Convolutional Encoder 110 is then sent to a Bit Interleaver 112 and the result is then transmitted over a communication channel 114 to the receiver portion 120 for decoding and processing.

In the channel decoder depicted in FIG. 1B, a Bit De-Interleaver 122 is first applied to the received signal. A soft-decision inner code decoder (e.g., Viterbi decoder) 124 receives as inputs soft symbols and outputs hard bit estimates for the inner block code. The outputs of the inner code decoder 124 are then byte-deinterleaved by Byte De-interleaver 126 and provided to an outer code decoder 128 (typically, a block decoder such as a Reed-Solomon decoder) that can correct multiple byte errors in a block. In effect, this prior art approach to concatenated decoding decomposes the task into two independent procedures: one for the inner code, and another for the outer code. An "optimal" decoder is selected and applied for each of these procedures. However, although each decoder may be optimal for its specific task, the overall composite system may not be optimal for a given concatenated code. This is because (1) the Reed-Solomon decoder uses hard- rather than soft-decision data, and (2) the Viterbi decoder performance could be improved in a second pass decoding operation. In particular, error bursts, which are observed in the first-pass decoding, could be broken up by using the bit decisions from blocks which were successfully decoded by a Reed-Solomon decoder. This operation would, in turn, impact a second-pass Reed-Solomon decoding of the data, perhaps enabling the Reed-Solomon decoder to correct another block that previously was considered uncorrectable.

In principle, the sharing of outer-to-inner code decoding information could be re-iterated, resulting in even further improvements.

Various iterative (turbo-like) decoding approaches have been used in simulation to decode serial concatenations of convolutional and Reed-Solomon codes. One problem in such decoding processes is determining how the Viterbi algorithm is to be modified to accommodate inputs from Reed-Solomon decoded blocks that are correct.

The present invention employs an improved decoding algorithm which overcomes the problem in the prior art's use of a Viterbi algorithm in an iterative decoding process. The invention thereby attains an effective iterative decoding scheme to improve the performance of the signal receiver.

SUMMARY OF THE INVENTION

The present invention relates to an improved decoding scheme for use in a concatenated channel decoder. The decoder of the present invention utilizes a Maximal a posteriori (MAP) algorithm in place of the Viterbi algorithm used in the prior art. Further, in the present invention, the decoding of the concatenated code is done iteratively to increase the confidence for any corrected symbols. As a result, the overall performance of the decoder is improved. This iterative process comprises the MAP decoder generating hard decision information with three values: 1 and 0 for hard bit decision, and an Erasure flag if the MAP decoder is not confident about whether this decoded data bit is '1' or '0'. The RS decoder, using this Erasure Information, attains better error correction performance than without having this Erasure Information. This improved output of the RS decoder combined with an RS decoder Error flag, which indicates whether the RS decoder output is correctable or not, are then supplied back to the MAP decoder as the new a priori information, thereby improving the performance of the system.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

Various embodiments of the present invention will now be described in detail in conjunction with the annexed drawings, in which:

FIGS. 1A and 1B are schematic diagrams of a conventional serial concatenated coding system encoder and decoder, respectively;

FIG. 2 is a schematic diagram of an exemplary communications system decoder built in accordance with the invention; and, FIG. 3 is a functional diagram illustrating an embodiment of the invention wherein iterative decoding for a concatenated SDARS is being performed.

DETAILED DESCRIPTION

Figure 3:
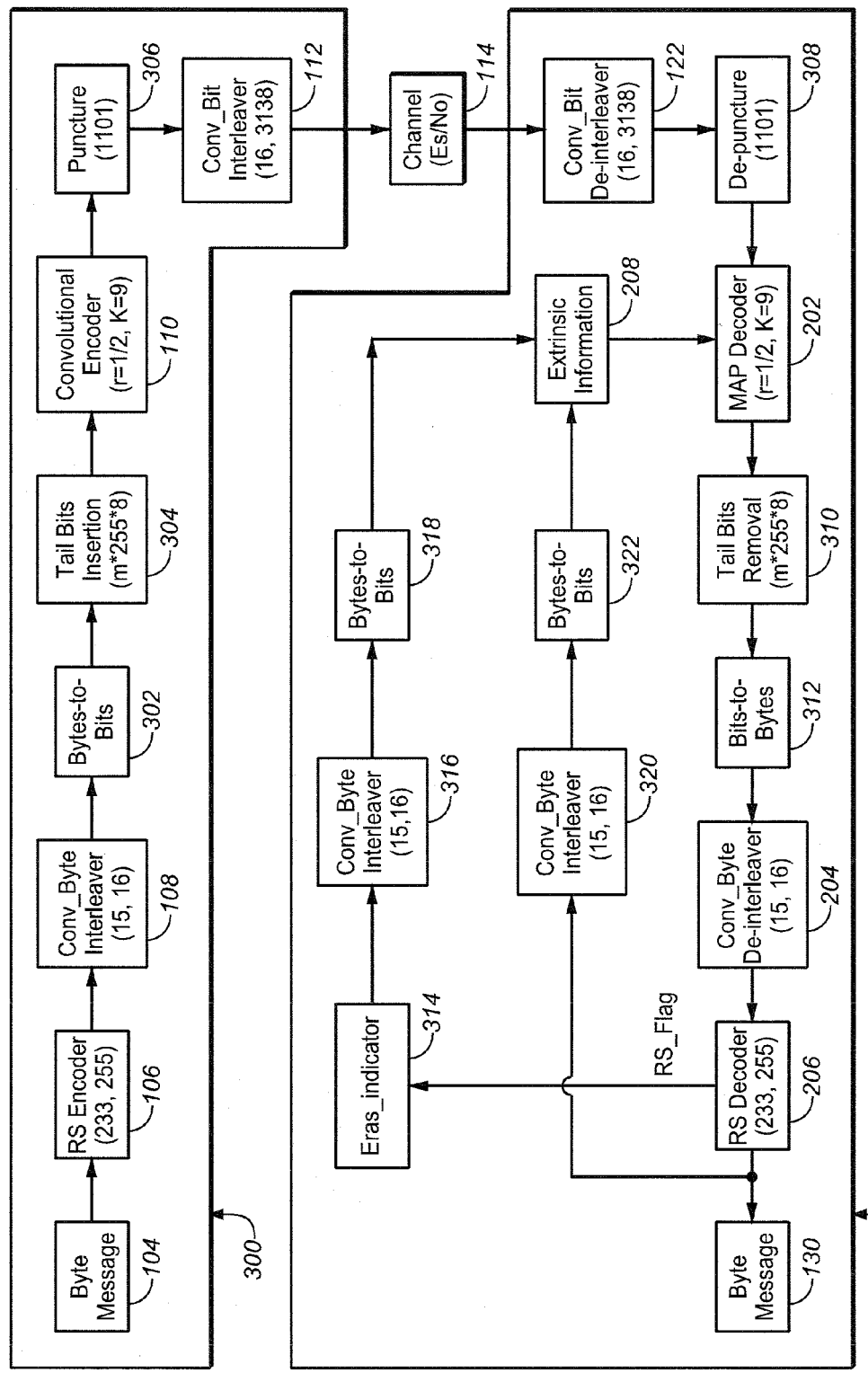

FIG. 2 illustrates an exemplary communications system decoder according to one embodiment of the invention. One distinguishing feature of the depicted decoder 200 over the prior art illustrated in FIG. 1B is the use of a maximal a posteriori (MAP) decoder 202 to generate hard decision bits plus Erasure indicators. The output of this decoder allows the decoding process to provide Erasure information rather than requiring the hard decisions outputted from the prior art VA decoder 124 of FIG. 1B. That is, based on the reliability of the MAP decoder, the output is quantized to one of three values: {1, 0, E} where {1, 0} are hard decision values derived when the reliability is larger than some threshold, and "E" (erasure) which is generated when the reliability is less than the threshold. The 'E' can be represented by a two bit value such as '11'.

The sequence of reliability values generated by the MAP decoder 202 is supplied to byte de-interleaver 204. Since the MAP decoder generates bit data with three values instead of two, the de-interleaver has to be modified from that of the prior art de-interleaver 126 depicted in FIG. 1B. In one embodiment of the invention, the size of the de-interleaver is increased to thereby accommodate the three values generated. In alternative embodiments of the invention, a conventional de-interleaver is coupled with some index array for the data bytes with Erasure bits in it.

The output of the de-interleaver 204 is supplied to the RS decoder 206 with erasures. As is well-known in the art, the erasure information is used by the RS decoder 206 to obtain better correction performance (assuming the erasure location is reliable). The output of the RS decoder 206 is the decoder output data 130 (once any necessary iterations are performed as discussed below).

In the current invention, the sequence of reliability values generated by each decoder (202 and 206) is passed to the other one. In this way, each decoder takes advantage of the "suggestions" of the other. Accordingly, the output of the RS decoder 206 is also supplied to the MAP decoder 202 through the extrinsic information generator 208. It generates the likelihood of the decoded data from RS decoder based on the RS Error flag, which indicates whether the corresponding RS decoder output is correctable or not. If the RS Error flag indicates that the RS decoder output data is correctable, then the likelihoods of those RS decoder output data is 100%; otherwise the likelihoods will be 50%, i.e., the RS decoder output data bits is equally possible to be '0' or '1'. This a priori information, which is the likelihood ratio of the data bit to be '1' vs. '0' based on both the RS decoder output data and the corresponding RS error flag, is then processed by byte interleaver 210 prior to being supplied to the MAP decoder. The MAP decoder receives this information in the form of a likelihood ratio for each bit, $Z_{i-1}$.

The embodiment of the invention depicted in FIG. 2 results in a SDARS concatenated channel decoder having improved performance. These improvements over the prior art depicted in FIG. 1B are attained as a result of replacing the VA decoder 124 with MAP decoder 202. Such a MAP decoder has higher complexity and cost than a VA decoder and as noted above, requires a more complex byte de-interleaver 204 than the byte de-interleaver 126 of the prior art. Further, as depicted in FIG. 2 an additional byte-interleaver 210 is required in the circuit.

FIG. 3 depicts a functional diagram of an additional embodiment of the invention in which iterative decoding for concatenated SDARS FEC is performed. FIG. 3 illustrates both the encoder 300 and decoder 301 components of this system. FIG. 3 expands on the system depicted in FIG. 2 by both including additional hardware items as well as details of sizes related to these components. By way of example, the convolution byte interleaver 108 has size (15,16) and convolution bit interleaver 112 (after puncture module 306) has size (16, 3138).

As previously described with respect to FIG. 2, the MAP decoder 202 provides an output to byte de-interleaver 204. This information, which includes identification of locations of potential bit error, is then supplied to RS decoder 206. The output of the RS decoder 206, combined with the RS decoder Error flag, is supplied back to the MAP decoder 202.

In one embodiment of the invention, the iterative operations performed by MAP decoder 202 and RS Decoder 206 are performed at least twice. In a further embodiment of the invention, the process is terminated once a settable parametric number of iterations have occurred. Alternatively, the process stops once no improvement occurs as to the number of flags generated at the output of RS Decoder 206 from the previous iteration.

The invention may be implemented by any reasonable means, including, but not limited to, software, firmware and/or hardware. Apparatus for practicing the invention may include processors, microprocessors, programmed general purpose computers, combinational logic circuits, other digital circuits, analog circuitry and/or combinations thereof.

While the invention has been described with reference to the preferred embodiment thereof, it will be appreciated by those of ordinary skill in the art that modifications can be made to the structure and elements of the invention without departing from the spirit and scope of the invention as a whole.

What is claimed is:

1. An iterative decoder method for decoding concatenated channel code consisting of convolution code and Reed-Solomon (RS) code, said method comprising:
    performing inner code decoding of a data block using a Maximal a posteriori (MAP) algorithm to generate hard decision information;
    utilizing said hard decision information in an RS decoder algorithm to attain an RS decoder output and an RS decoder Error Flag; and,
    supplying said RS decoder output and said RS decoder Error Flag to said MAP algorithm.

2. The method of claim 1 wherein each of said performing and said utilizing steps are performed at least twice.

3. The method of claim 1 wherein said performing step and said utilizing step are repeatedly performed for a selectable number of iterations.

4. The method of claim 1 further comprising:
    conducting repeated iterations of said performing step and said utilizing step until an iteration yields no further improvement in the results from the RS algorithm relative to the previous iteration.

5. The method of claim 1 wherein the hard decision information comprises three values:
    a "1" and a "0" representing a hard bit decision, and
    Erasure information indicative of the MAP decoder's confidence as to whether the decoded bit is a "1" or a "0".

6. The method of claim 2 wherein:
    a hard bit decision of a "1" or a "0" is made when the confidence of the MAP decoder is larger than a predetermined threshold; and,
    said Erasure information is supplied as a two bit value when said confidence is less than said threshold.

7. The method of claim 3 further wherein the Erasure information is supplied to the RS algorithm as an index array.

8. A computer program product embodied on computer readable media readable by a computing device for decoding concatenated channel code consisting of convolution code and Reed-Solomon (RS) code, the product comprising:
    computer-readable program code for performing inner code decoding of a data block using a Maximal a posteriori (MAP) algorithm to generate hard decision information;
    computer-readable program code for utilizing said hard decision information in an RS decoder algorithm to attain an RS decoder output and an RS decoder Error Flag; and,
    computer-readable program code for supplying said RS decoder output and said RS decoder Error Flag to said MAP algorithm.

9. The product of claim 8 wherein each of said code for performing and said code for utilizing is executed at least twice.

10. The product of claim 8 wherein said code for performing and said code for utilizing are repeatedly executed for a selectable number of iterations.

11. The product of claim 8 further comprising:
    computer-readable program code for conducting repeated iterations of said performing step and said utilizing step until an iteration yields no further improvement in the results from the RS algorithm relative to the previous iteration.

12. The product of claim 8 wherein the hard decision information comprises three values:
    a "1" and a "0" representing a hard bit decision, and
    Erasure information indicative of the MAP decoder's confidence as to whether the decoded bit is a "1" or a "0".

13. The product of claim 12 wherein:
    a hard bit decision of a "1" or a "0" is made when the confidence of the MAP decoder is larger than a predetermined threshold; and,
    said Erasure information is supplied as a two bit value when said confidence is less than said threshold.

14. The product of claim 13 further wherein the Erasure information is supplied to the RS algorithm as an index array.

* * * * *